(12) United States Patent
Wholey et al.

(10) Patent No.: US 8,344,504 B2
(45) Date of Patent: Jan. 1, 2013

(54) SEMICONDUCTOR STRUCTURE COMPRISING PILLAR AND MOISTURE BARRIER

(75) Inventors: James Wholey, Saratoga, CA (US); Ray Parkhurst, Santa Clara, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/075,493

(22) Filed: Mar. 30, 2011

(65) Prior Publication Data

US 2012/0025370 A1    Feb. 2, 2012

Related U.S. Application Data

(63) Continuation-in-part of application No. 12/846,060, filed on Jul. 29, 2010.

(51) Int. Cl.
*H01L 23/04* (2006.01)
*H01L 23/52* (2006.01)
(52) U.S. Cl. .............. 257/730; 257/776; 257/E23.068
(58) Field of Classification Search .......... 257/737, 257/194, E23.068, 776, 678, 713, 730
See application file for complete search history.

(56) References Cited

U.S. PATENT DOCUMENTS

| | | | |
|---|---|---|---|
| 5,578,841 A | 11/1996 | Vasquez et al. | |
| 6,472,738 B2 | 10/2002 | Suzuki | |
| 6,753,608 B2 | 6/2004 | Tomita | |
| 7,230,337 B2 | 6/2007 | Usami et al. | |
| 7,372,154 B2 | 5/2008 | Tanaka et al. | |
| 7,429,502 B2 | 9/2008 | Archer, III et al. | |
| 7,642,128 B1 | 1/2010 | Lin et al. | |
| 7,906,851 B2 | 3/2011 | Watanabe | |
| 2002/0171138 A1 | 11/2002 | Osone et al. | |
| 2006/0170113 A1 | 8/2006 | Tanaka et al. | |
| 2007/0023904 A1 | 2/2007 | Salmon et al. | |
| 2007/0023923 A1 | 2/2007 | Salmon et al. | |
| 2007/0184579 A1 | 8/2007 | Huang et al. | |
| 2008/0093746 A1* | 4/2008 | Lee et al. .................. 257/776 |
| 2008/0296690 A1 | 12/2008 | Anderson et al. | |
| 2009/0008801 A1 | 1/2009 | Lai et al. | |
| 2010/0059853 A1 | 3/2010 | Lin et al. | |
| 2010/0133704 A1 | 6/2010 | Marimuthu et al. | |
| 2010/0219527 A1 | 9/2010 | Feustel et al. | |
| 2011/0156220 A1 | 6/2011 | Koagawa et al. | |

OTHER PUBLICATIONS

Sze, "Semiconductor devices, physics and technology", 2002, John Wiley and Sons, pp. 489, 496, 497, 503, 504.*
"Co-pending U.S. Appl. No. 12/846,060, filed Jul. 29, 2010".
"Co-pending U.S. Appl. No. 13/075,493, filed Mar. 30, 2011".

* cited by examiner

*Primary Examiner* — Matthew Reames
*Assistant Examiner* — Nikolay Yushin

(57) ABSTRACT

A semiconductor structure includes multiple semiconductor devices on a substrate and a metal layer disposed over the semiconductor devices, the metal layer comprising at least a first trace and a second trace. A conductive pillar is disposed directly on and in electrical contact with the first trace of the metal layer, and a dielectric layer is selectively disposed between the metal layer and the conductive pillar, where the dielectric layer electrically isolates the second trace from the pillar. A moisture barrier surrounds the semiconductor devices around a periphery of the semiconductor structure, and extends from the substrate through the dielectric layer to the conductive pillar.

20 Claims, 10 Drawing Sheets

SEMICONDUCTOR STRUCTURE COMPRISING PILLAR AND MOISTURE BARRIER

This is a continuation-in-part of application Ser. No. 12/846,060, filed Jul. 29, 2010, the contents of which are hereby incorporated by reference in their entirety.

BACKGROUND

Packaging of semiconductor devices has lead to the implementation of various techniques to effect electrical connections to the semiconductor devices as well as to effect paths to dissipate heat. One known technique to provide electrical connections includes selectively bonding wires to the semiconductor device. This technique referred to as "wire-bonding" has certain drawbacks. For example, wire bonds add parasitic inductance, which can impact the performance of the semiconductor device especially at comparatively high frequency operation. In addition, wire bonds do not efficiently dissipate heat away from the semiconductor device. These and other drawbacks to wire-bonding have led to the implementation of so-called pillars as an alternate method of providing electrical and thermal connections to semiconductor devices.

FIG. 1 shows a conventional semiconductor structure 100. The semiconductor structure 100 comprises a substrate 101. The substrate 101 is GaAs and includes a collector layer 102 formed therein by known methods. A base layer 103 is provided over the collector layer 102, and an emitter layer 104 is provided over the collector layer 102 to provide a heterojunction bipolar transistor (HBT).

Contacts 105 are made to the base layer 103 and the collector layer 102. A first metal layer 106 is provided on the contacts 105 and the emitter layer 104. A second metal layer 107 is provided on the first metal layer 106. The first metal layer 106 and the second metal layer 107 are used for routing signals to and from the HBT. A third metal layer 108 is provided on the second metal layer 107. The third metal layer 108 provides a planar surface for attachment of a pillar 109 thereover. The pillar 109 provides a thermal dissipation path and electrical ground through the third metal layer 108. A layer 110 of benzocyclobutene (BCB) or polyimide is provided beneath the third metal layer 108 and provides a planar surface on which the third metal layer 108 is formed.

Because each successive metal layer must fit within the "footprint" of the last metal layer, the feature size of each successive metal layer must be smaller than the feature size of the previous metal layer. For example, second metal layer 107 has narrower line-widths than the first metal layer 106. However, with each successive metal layer, photolithographic resolution is reduced. Limits on photolithographic resolution result in an overall increase in the feature size of each successive metal layer, and ultimately an increase in the size of the die of the semiconductor structure. Moreover, in the semiconductor structure 100, the upper-most metal layer (third metal layer 108) is comparatively thick, but cannot be used for signal routing under the pillar 109. Thus, the current-handling capability of the upper-most metal layer is not efficiently utilized in the semiconductor structure 100.

There is a need, therefore, for a semiconductor structure that supports a minimum number of metal layers to be used, while overcoming at least the shortcomings of known semiconductor interconnect structures discussed above. In addition, there is a need for a moisture bather to prevent seepage of moisture, through the BCB or polyimide layer, for example, upon removal of the upper-most metal layer, in order to prevent short circuits in the semiconductor structure.

SUMMARY

In a representative embodiment, a semiconductor structure includes multiple semiconductor devices on a substrate and a metal layer disposed over the semiconductor devices, the metal layer including at least a first trace and a second trace. A conductive pillar is disposed directly on and in electrical contact with the first trace of the metal layer. A dielectric layer is selectively disposed between the metal layer and the conductive pillar, where the dielectric layer electrically isolates the second trace from the pillar. A moisture barrier surrounds the semiconductor devices along a periphery of the semiconductor structure, and extends from the substrate through the dielectric layer to the conductive pillar.

In another representative embodiment, a semiconductor structure includes a semiconductor device on a substrate, first and second metal layers, a moisture barrier and a conductive pillar. The first metal layer includes a first trace disposed over the semiconductor device. The second metal layer includes second and third traces, the second trace being disposed over the first trace of the first metal layer and the third trace being separated from the first and second traces by a dielectric layer. The moisture barrier includes at least the third trace of the second metal layer. The conductive pillar is disposed directly on and in mechanical contact with the second trace and the third trace of the second metal layer. The moisture barrier is located between the second trace of the second metal layer and an outer edge of the conductive pillar, and extends from the substrate through the dielectric layer to the conductive pillar, preventing moisture from entering the semiconductor device through the dielectric layer.

In another representative embodiment, a semiconductor includes a metal layer, a conductive pillar, a dielectric layer and a moisture barrier. The metal layer is disposed over a semiconductor device, and includes at least a first trace and a second trace. The conductive pillar is disposed on and in direct electrical and mechanical contact with the first trace of the metal layer. The dielectric layer is selectively disposed between the metal layer and the conductive pillar, where the dielectric layer electrically isolates the second trace from the pillar. The moisture barrier is formed around a periphery of the semiconductor structure, located between the first trace of the metal layer and an outer edge of the conductive pillar, and extends from a substrate of the semiconductor device through the dielectric layer to the conductive pillar.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Figure 2A:
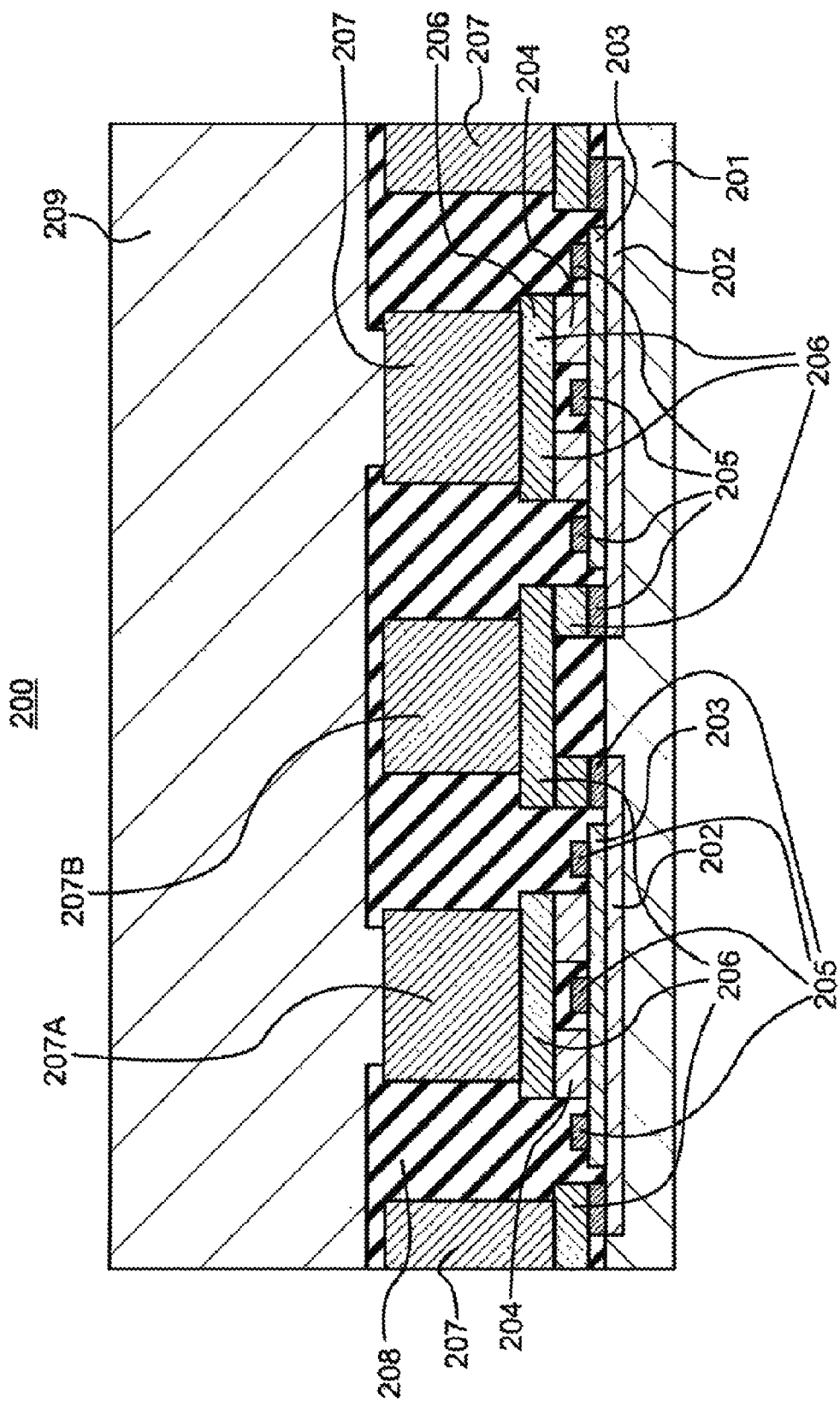
FIG. 2A shows a cross-sectional view of a semiconductor structure in accordance with a representative embodiment.

FIG. 2A shows a cross-sectional view of a semiconductor structure 200 in accordance with a representative embodiment. The semiconductor structure 200 comprises a substrate 201 which may be selected based on the active semiconductor device fabricated thereon. In certain embodiments, the substrate 201 comprises a semiconductor material. Illustrative semiconductor materials for the substrate 201 include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond for the substrate 201 fabricated by a known chemical vapor deposition (CVD) method, for example.

As should be appreciated, the selection of the active semiconductor device and the material for the substrate 201 dictates the processing techniques and materials selected for fabricating the active semiconductor device and other components of the semiconductor structure 200. Such techniques and materials are within the purview of one of ordinary skill in the art of semiconductor processing and are generally not detailed herein to avoid obscuring the description of the representative embodiments.

For ease of description, the substrate 201 comprises GaAs, and the active semiconductor device is a heterojunction bipolar transistor (HBT). It is emphasized that the selection of GaAs for the substrate 201 and the selection of the HBT device are merely illustrative, and other substrate materials and active devices are contemplated. Illustratively, the active device may be a pseudomorphic high electron mobility transistor (pHEMT), or an enhanced pseudomorphic high electron mobility transistor (E-pHEMT). Alternatively, the substrate may comprise silicon and the active device may comprise a metal oxide semiconductor (MOS) device such as a MOS field effect transistor (MOSFET) or complementary MOS (CMOS) device. Additionally, a combination of a plurality of the different active devices may be provided over the substrate 201 to provide a desired circuit. Furthermore, the active devices of the semiconductor structure 200 may provide power amplifiers and other devices that require heat dissipation. While such power devices are illustrative, other active semiconductor devices that do not require the same degree of heat dissipation as power devices (e.g., power amplifiers) are contemplated to be included in the semiconductor structure 200.

It is noted that the semiconductor structure 200 may comprise passive electrical components (not shown in FIG. 2A) formed in or over the substrate 201 and in addition to active semiconductor devices referenced above. The combination of active semiconductor devices and passive electrical components provides electrical circuits of the semiconductor structure 200. Passive electrical components include for example, resistors, capacitors, signal transmission lines (transmission lines), and inductors. These passive electrical components may be selectively electrically connected to the active semiconductor device(s) to provide a desired circuit. The passive electrical components may be fabricated using known methods and materials. Notably, the various current-carrying traces of the semiconductor structure 200 can function as transmission lines and inductors. In certain embodiments, only passive electrical components are provided, rather than a semiconductor material, the substrate 201 comprises an insulator such as a suitable glass material or sapphire.

Referring again to FIG. 2A, the representative HBT comprises a collector 202, a base 203 and an emitter 204 formed in/over the substrate 201 with known materials and by known methods. Ohmic contacts ("contacts") 205 are selectively provided to the base 203 and the collector 202 as shown. Contacts 205 are generally gold (Au) and are formed by known methods. In the representative embodiment, a first metal layer 206 is selectively disposed over the contacts 205 to the base 203 and the collector 202, and over the emitter 204. Illustratively, the first metal layer 206 comprises gold. Alternatively, the first metal layer 206 may comprise aluminum, copper or other conductive material compatible with semiconductor processes.

The first metal layer 206 comprises signal traces for carrying electrical signals to and from the emitter 204, the base 203 and the collector 202 of the HBT. As discussed more fully below, the first metal layer 206 also comprises electrical ground traces and thermal paths for heat dissipation. Trace widths of the signal and ground traces of the first metal layer 206 can be less than approximately 1.0 µm to greater than approximately 100 µm, for example. Typically, however, the trace widths of the signal and ground traces of the first metal layer 206 are in the range of approximately 2.0 µm to approximately 20.0 µm. Moreover, the thickness of the signal and ground traces of the first metal layer 206 is illustratively in the range of approximately 0.2 µm to approximately 2.0 µm.

The semiconductor structure 200 also comprises a second metal layer 207 selectively disposed over the first metal layer 206. In the representative embodiment, the second metal layer 207 comprises signal traces for carrying electrical signals to and from the collector 202, electrical ground traces for connection to the emitter 204, and provides thermal paths for heat dissipation. Illustratively, the second metal layer 207 comprises gold. Alternatively, the second metal layer 207 may comprise aluminum, copper or other conductive material compatible with semiconductor processes.

Trace widths of the signal and ground traces of the second metal layer 207 are typically in the range of approximately 3.0 µm to approximately 50.0 µm, for example. Moreover, the thickness of the signal and ground traces of the second metal layer 207 is illustratively in the range of approximately 1.0 µm to approximately 4.0 µm.

The semiconductor structure 200 also comprises a dielectric layer 208 selectively disposed over the HBT (or other active semiconductor device(s)), the contacts 205, the first metal layer 206, and the second metal layer 207. As described more fully below, the dielectric layer 208 provides electrical isolation of certain traces of the first metal layer 206 and of the second metal layer 207, and mechanical support of layers disposed over the dielectric layer 208. In certain representative embodiments, the dielectric layer 208 comprises one of silicon nitride ($Si_3N_4$), silicon dioxide ($SiO_2$), aluminum nitride (AlN) or an oxynitride (e.g., aluminum oxynitride). As discussed more fully below, the selection of one of these dielectric materials provides the advantage of improved thermal conductivity for heat dissipation, as well as selective electrical isolation of the contacts 205, and the respective traces of the first metal layer 206 and the second metal layer 207. Alternatively, the dielectric layer 208 may comprise a known spun-on dielectric, such as BCB or polyimide or a combination of BCB or polyimide, and silicon oxide, silicon nitride or silicon oxynitride. For example, in a representative embodiment, the dielectric layer 208 may comprise a layer of BCB that is "spun on," and subsequently covered with a layer of silicon nitride by a known technique.

The semiconductor structure 200 also comprises an electrically conductive pillar ("pillar") 209. The pillar 209 provides a thermal path to transfer heat from the HBT (or other active semiconductor device of the semiconductor structure 200) and passive electrical components, and provides selective electrical connections to the second metal layer 207. Notably, the pillar 209 is in direct contact with and is disposed directly on certain traces of the second metal layer 207 to selectively provide electrical connections (a ground connection or a signal connection) and to provide paths for thermal dissipation of heat. As described more fully below, the semiconductor structure 200 generally comprises more than one pillar 209, with each pillar 209 being connected to different active semiconductor devices, or passive electrical components, or both located in/over different areas of the substrate 201. As further described below, the pillar(s) 209 are connected to a second substrate (not shown in FIG. 2A), which comprises external circuitry (not shown) to include active semiconductor devices, passive electrical components and ground connections (e.g., conductive vias). The external circuitry of the second substrate in turn may be connected to further external circuitry (also not shown), which also may include active semiconductor devices, passive electrical components and ground connections. Depending on the selected connection of the pillar 209 to external circuitry (not shown), the pillar 209 can provide signal connections or ground connections between active semiconductor devices, or passive electrical components, or both, of the semiconductor structure 200. Selective electrical connection of ground traces of the second metal layer 207 to one of the pillars 209 results in a "ground pillar." Selective electrical connection of signal traces of the second metal layer 207 to another of the pillars 209 results in a "signal pillar." Other traces of the second metal layer 207 are electrically isolated from the pillar 209, but heat is dissipated from the second metal layer 207 through the dielectric layer 208.

Illustratively, the pillar 209 is in direct contact with and is disposed directly on trace 207A of the second metal layer 207. Thus, trace 207A of the second metal layer 207 electrically connects the pillar 209 to the first metal layer 206, and ultimately to the emitter of the HBT as shown. Depending on the connection of the pillar 209 to the external circuitry, the electrical connection between the trace 207A and the pillar 209 will be either an electrical signal connection or an electrical ground connection. Trace 207A of the second metal layer 207 provides both an electrical conduction path and a thermal conduction path from the emitter 204 of the HBT. By contrast, trace 207B of the second metal layer 207 is mechanically connected to the pillar 209, but is electrically isolated from the pillar 209 by the dielectric layer 208. Thus, the pillar 209 is not in direct contact with trace 207B, but instead is in direct contact with and is disposed on the dielectric layer 208. As such, the collector 202 of the HBT is electrically isolated from the pillar 209. However, the mechanical connection between the collector 202, the dielectric layer 208 and the pillar 209 provides a thermal path for conduction of heat from the collector 202 of the HBT via the trace 207B of the second metal layer 207 to the pillar 209 through the dielectric layer 208.

The pillar 209 illustratively comprises copper (Cu) formed by a known method such as evaporation or plating. The pillar 209 has sufficient thickness for providing both current carrying capability from the second metal layer 207 (e.g., through trace 207A) and heat dissipation from the second metal layer 207 (e.g., through traces 207A and 207B). Typically, the pillar 209 comprises copper having a thickness in the range of approximately 10 μm to approximately 100 μm and greater than 100 μm, for example. The thermal and electrical conductivity of copper are advantageous over other conductors such as gold. However, other electrically and thermally conductive materials are contemplated for use as the pillar 209. Illustratively, the pillar 209 may comprise silver (Ag) or a solder material such as tin (Sn). The silver may be deposited by a known method, and solder may be applied using known solder bump deposition methods.

In certain embodiments, the pillar 209 comprises a single layer of the selected conductive material (e.g., copper). It is emphasized that this is merely illustrative, and the pillar 209 may comprise more than one layer of the selected conductive material (e.g., multiple layers of copper). Alternatively, the pillar 209 may comprise layers of different materials. For example, in certain embodiments the pillar 209 comprises a comparatively thick (e.g., 45 μm) layer of copper and a layer of solder (e.g., 30 μm), such as SnAg or SnCu solder disposed over the layer of copper. Still alternatively, the pillar 209 may comprise a first layer of copper having a thickness of approximately 10 μm disposed immediately over the upper-most metal layer (second metal layer 207 in the illustrative embodiment) and making selective electrical contact therewith; a second layer of copper having a thickness of approximately 35 μm disposed over the first layer of copper; and a layer of solder (e.g., SnAg or SnCu) having a thickness of approximately 35 μm disposed over the second layer of copper.

The selective electrical and thermal connections between the pillar 209 and the second metal layer 207 provide certain advantages over known structures. For example, discontinuous electrical and mechanical connections are provided between the second metal layer 207 and the pillar 209. This allows the elimination of a continuous metal layer between the pillar 209 and the second metal layer 207. As should be appreciated by one of ordinary skill in the art, the elimination of this additional metal layer accords finer features at the upper-most metal layer of the semiconductor structure 200. Ultimately, this allows for comparatively reduced pitch of the metal traces of the semiconductor structure 200. Moreover, because the features of the upper-most metal layer (second metal layer 207 in the present embodiment) can be made comparatively small, the thickness of the upper-most metal layer can be made comparatively large. This increased thickness improves the current-carrying capability of the traces (e.g., trace 207A) of the upper-most metal layer (e.g., second metal layer 207) of the semiconductor structure 200. Beneficially, by connecting the pillar 209 directly to the upper-most metal layer (the second metal layer 207 in this embodiment) comprising signal traces or ground traces, a comparatively thick trace can be used for current routing under the pillar 209 than if the upper-most metal layer was used for attaching the pillar 209 and a lower (and thinner) metal layer was used for current routing.

The dielectric layer 208 is deposited conformally over the HBT, the contacts 205, the first metal layer 206 and the second metal layer 207 by a known deposition method. Selective etching by known masking and plasma etching techniques removes the dielectric from the upper surfaces of the selected traces (e.g., trace 207A) of the second metal layer 207 to allow for selective electrical connection between the pillar 209 and the second metal layer 207. By not removing the dielectric layer 208 from selected traces (e.g., trace 207B), the dielectric layer 208 provides selective electrical isolation of second metal layer 207 and the pillar 209.

As noted, in certain embodiments, the dielectric layer 208 comprises a material having comparatively good thermal conductivity, which improves the dissipation of heat from the underlying active semiconductor device (e.g., the HBT), through the contacts 205, the first metal layer 206, and the second metal layer 207. Moreover, Applicants have discovered an improved mechanical adhesion of the pillar 209 to the dielectric layer 208 can be realized by selection of dielectric layers that have a lesser degree of planarity upon deposition. For example, the use of silicon nitride provides a lesser degree of planarity at the interface of the dielectric layer 208 and the pillar 209. This reduced planarity has been found to result in an improved mechanical adhesion of the pillar 209 to the dielectric layer 208, and as a result, in an improved mechanical robustness of the semiconductor structure 200.

Figure 2B:
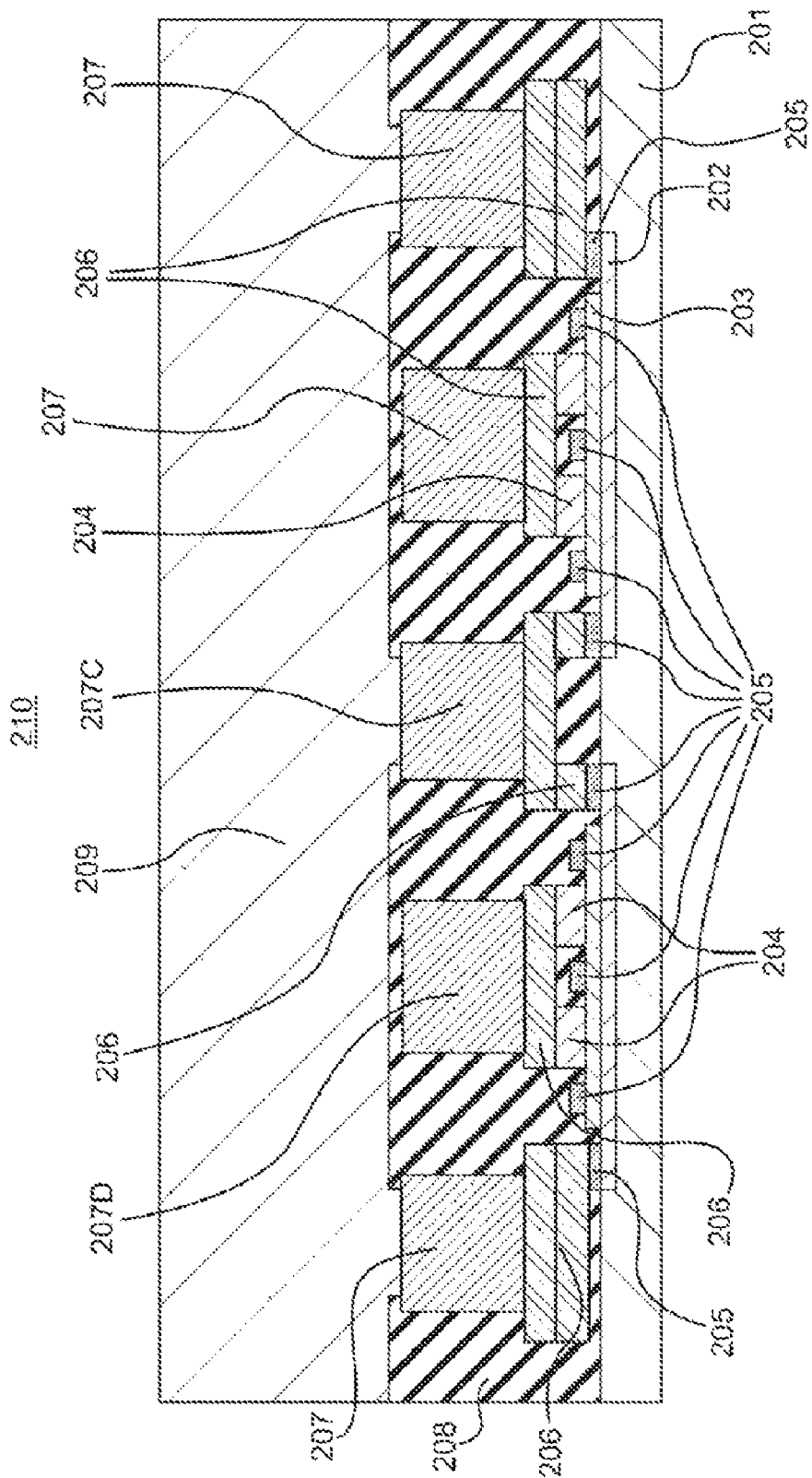
FIG. 2B shows a cross-sectional view of a semiconductor structure in accordance with a representative embodiment.

FIG. 2B shows a cross-sectional view of a semiconductor structure 210 in accordance with a representative embodiment. Some of the features of semiconductor structure 200 are common to the semiconductor structure 210. Details of these common features may not be repeated so as to avoid obscuring the details of the presently described embodiments.

The semiconductor structure 210 comprises substrate 201 which is selected based on the active semiconductor device fabricated thereon. In certain embodiments, the substrate 201 comprises a semiconductor material. Illustrative semiconductor materials for the substrate 201 include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond for the substrate 201 fabricated by a known chemical vapor deposition (CVD) method.

Again, for ease of description, the substrate 201 comprises GaAs, and the active semiconductor device is a heterojunction bipolar transistor (HBT). It is emphasized that the selection of GaAs for the substrate 201 and the selection of the HBT device are merely illustrative, and other substrate materials and active devices are contemplated. Illustratively, the active device may be a pseudomorphic high electron mobility transistor (pHEMT) or an enhanced pseudomorphic high electron mobility transistor (E-pHEMT). Alternatively, the substrate may comprise silicon and the active device may comprise a metal oxide semiconductor (MOS) device such as a MOS field effect transistor (MOSFET) or complementary MOS (CMOS) device. Additionally, a combination of active devices may be provided over the substrate 201 to provide a desired circuit. Furthermore, the active devices of the semiconductor structure 210 may provide power amplifiers and other devices that require heat dissipation. While such power devices are illustrative, other active semiconductor devices that do not require the same degree of heat dissipation as power devices (e.g., power amplifiers) are contemplated to be included in the semiconductor structure 210.

It is noted that the semiconductor structure 210 may comprise passive electrical components (not shown in FIG. 2B) formed in or over the substrate 201 and in addition to active semiconductor devices referenced above. The combination of active semiconductor devices and passive electrical components provides electrical circuits of the semiconductor structure 210. Passive electrical components include for example, resistors, capacitors, signal transmission lines (transmission lines), and inductors. These passive electrical components may be selectively electrically connected to the active semiconductor device to provide a desired circuit. The passive electrical components may be fabricated using known methods and materials. Notably, the various current-carrying traces of the semiconductor structure 210 can function as transmission lines and inductors. In certain embodiments, only passive electrical elements are provided, rather than a semiconductor material, the substrate 201 comprises an insulator such as a suitable glass material or sapphire.

The HBT comprises collector 202, base 203 and emitter 204. Ohmic contacts ("contacts") 205 are selectively provided to the base 203 and collector 202 as shown. Contacts 205 are generally gold (Au) and are formed by known methods. In the representative embodiment, first metal layer 206 is selectively disposed over the contacts 205 to the base 203 and the collector 202, and over the emitter 204. Illustratively, the first metal layer 206 comprises gold. Alternatively, the first metal layer 206 may comprise aluminum, or copper or other conductive material, for example.

The first metal layer 206 comprises electrical signal traces for carrying electrical signals to and from the emitter 204, the base 203 and the collector 202 of the HBT. As discussed more fully below, the first metal layer 206 also comprises electrical ground traces and thermal paths for heat dissipation. Trace widths of the signal and ground traces of the first metal layer 206 can be less than approximately 1.0 µm to greater than approximately 100 µm, for example. Typically, however, the trace widths of the signal and ground traces of the first metal layer 206 are in the range of approximately 2.0 µm to approximately 20.0 µm. Moreover, the thickness of the signal and ground traces of the first metal layer 206 is illustratively in the range of approximately 0.2 µm to approximately 2.0 µm.

The semiconductor structure 210 also comprises second metal layer 207 selectively disposed over the first metal layer 206. The second metal layer 207 comprises signal traces for carrying electrical signals to and from the collector 202, electrical ground traces for connection to the emitter 204, and thermal paths for heat dissipation. Illustratively, the second metal layer 207 comprises gold. Alternatively, the second metal layer 207 may comprise aluminum or copper or other conductive material compatible with semiconductor processes.

Trace widths of the signal and ground traces of the second metal layer 207 are typically in the range of approximately 3.0 µm to approximately 50.0 µm, for example. Moreover, the thickness of the signal and ground traces of the second metal layer 207 is illustratively in the range of approximately 1.0 µm to approximately 4.0 µm.

The semiconductor structure 210 also comprises dielectric layer 208 selectively disposed over the HBT (or other active semiconductor device), the contacts 205, the first metal layer 206, and the second metal layer 207. As described more fully below, the dielectric layer 208 provides electrical isolation of certain traces of the first metal layer 206 and of the second metal layer 207, and mechanical support of layers disposed over the dielectric layer 208. In certain representative embodiments, the dielectric layer 208 comprises one of silicon nitride ($Si_3N_4$), silicon dioxide ($SiO_2$), aluminum nitride (AlN) or an oxynitride (e.g., aluminum oxynitride). Alternatively, the dielectric layer 208 may comprise a known spun-on dielectric such as BCB or polyimide or a combination of BCB or polyimide, and silicon oxide, silicon nitride or silicon oxynitride. For example, in a representative embodiment, a layer of BCB may be spun on, and subsequently covered with a layer of silicon nitride to provide the dielectric layer 208.

The semiconductor structure 210 also comprises electrically conductive pillar 209. The pillar 209 provides a thermal path to transfer heat from the HBT (or other active semiconductor devices of the semiconductor structure 210), from passive electrical components, and provides selective electrical connection to the second metal layer 207. As noted previously, the semiconductor structure 210 generally comprises more than one pillar 209, with each pillar 209 being connected to different areas of the substrate 201. As further described below, the pillar(s) 209 are connected to a second substrate (not shown in FIG. 2B), which comprises external circuitry (not shown) to include active semiconductor devices and passive electrical components. The external circuitry of the second substrate in turn may be connected to further external circuitry (also not shown), which also may include active semiconductor devices and passive electrical components.

In the representative embodiment depicted in FIG. 2B, the pillar 209 is in direct contact with and is disposed directly on the second metal layer 207. As such, the pillar 209 is in contact with collectors 202 of the HBTs of the semiconductor structure 210 via second metal layer 207 to selectively provide electrical signal connections thereto from external circuitry (not shown) such as from a second substrate (not shown in FIG. 2B) to which the pillar 209 is connected. For example, the pillar 209 is disposed directly on and is in direct contact with trace 207C of the second metal layer 207. Thus, trace 207C of the second metal layer 207 electrically connects the pillar 209 to the first metal layer 206, and ultimately to the collector 202 of the HBT as shown. In such a configuration, the pillar 209 functions as a "signal pillar."

Moreover, the pillar 209 provides paths for thermal dissipation of heat from active semiconductor devices, or passive electrical components, or both, disposed on the substrate 201. Trace 207C of the second metal layer 207 provides both an electrical conduction path and a thermal conduction path from the collector 202 of the HBT. Other traces of the second metal layer 207 of the semiconductor structure 210 are electrically isolated from the pillar 209, but heat is dissipated from the second metal layer 207 through the dielectric layer 208. For example, trace 207D of the second metal layer 207 is mechanically connected to the pillar 209, but is electrically isolated from the pillar 209 by the dielectric layer 208. Thus, the pillar 209 is not in direct contact with trace 207D, but instead is in direct contact with and is disposed on the dielectric layer 208. As such, the emitter 204 of the HBT is electrically isolated from the pillar 209. However, the mechanical connection provides a thermal path for conduction of heat from the emitter 204 of the HBT via the trace 207D of the second metal layer 207 to the pillar 209 through the dielectric layer 208. Similarly, the base 203 is separated from the pillar 209 by the dielectric layer 208 and is electrically isolated from the pillar 209. However, the mechanical connection provides a thermal path for conduction of heat from the emitter 204 of the HBT. The pillar(s) 209 generally may be connected to a second substrate (not shown in FIG. 2B), which comprises external circuitry (not shown).

Figure 2C:
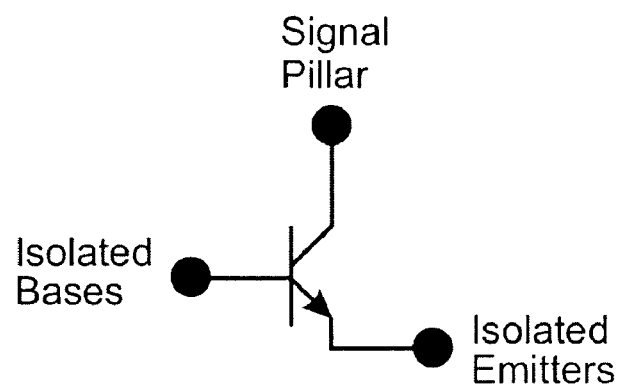
FIG. 2C shows a simplified schematic diagram of a semiconductor device of the semiconductor structure of FIG. 2B.

FIG. 2C shows a simplified schematic diagram of an HBT of the semiconductor structure 210 depicted in FIG. 2B. Notably, the collector 202 of the HBT is connected to the pillar 209, and thus the pillar 209 is a "signal pillar." The disposition of the dielectric layer 208 between the pillar 209 and the base 203 and the emitter 204 result in the "isolated bases" and "isolated emitters" as depicted in the simplified schematic diagram.

Figure 3:
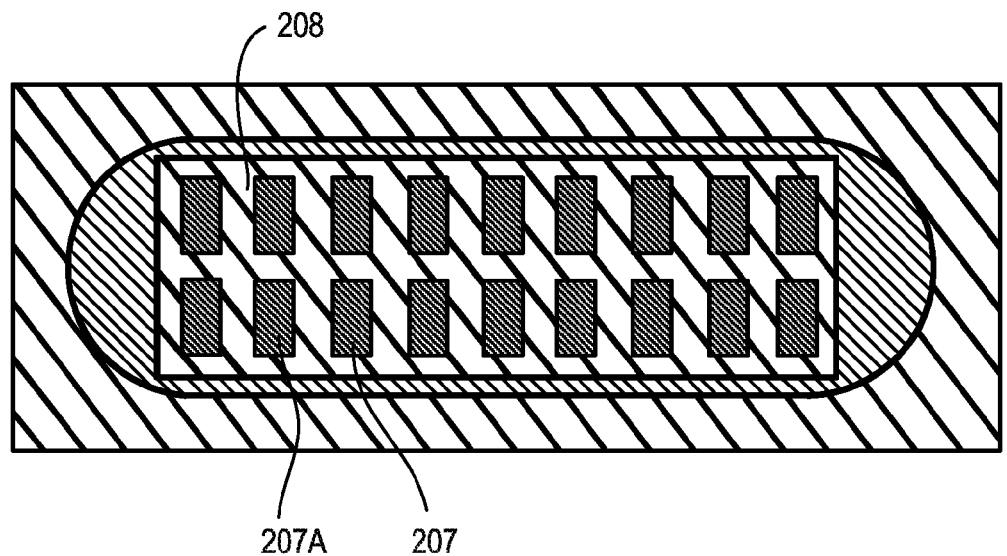
FIG. 3 shows a top view of the semiconductor structure of FIG. 2A before disposition of the pillar.

FIG. 3 shows a top view of the semiconductor structure 200 of FIG. 2A before disposition of the pillar 209. As should be appreciated by one of ordinary skill in the art, the fabrication sequence that results in the semiconductor structure depicted in FIG. 3 is the so-called "front-end" processing of the semiconductor structure 200. A subsequent fabrication sequence to provide the pillar 209 and, as described below, to provide attachment to subsequent substrates (not shown in FIG. 3) and structures is the so-called "back-end" processing of the semiconductor structure 200.

Notably, trace 207A is shown with the second metal layer 207 shown generally. As should be appreciated, each exposed trace (e.g., 207A) of the second metal layer 207 provides an electrical and mechanical connection to the first metal layer 206 (not shown in FIG. 3) and the selected components of the underlying HBT. For example, in the presently described embodiment, the exposed traces of the second metal layer 207 make electrical contact to the emitter 204 (not shown in FIG. 3) via the first metal layer 206. By contrast, other metal traces of the second metal layer 207 (e.g., trace 207B (not shown in FIG. 3)) are covered by the dielectric layer 208 and are thus electrically isolated from the pillar 209 (not shown in FIG. 3). For example, in the presently described embodiment, electrically isolated traces of the second metal layer 207 provide electrical isolation of the collector 202 and the pillar 209. However, the mechanical connection between the pillar 209 and the electrically isolated traces of the second metal layer 207 is provided. This provides a thermal path for heat dissipation from the collector 202, for example. As noted above, the elimination of an additional metal layer (e.g., third metal layer 108 of FIG. 1) accords finer features at the upper-most metal layer of the semiconductor structure 200. Ultimately, this allows for a comparatively reduced pitch of the metal traces of the second metal layer 207 of the semiconductor structure 200. Notably, the pitch between the exposed metal traces of the second metal layer 207 (e.g., trace 207A) is approximately 22.0 µm, for example.

Figure 4:
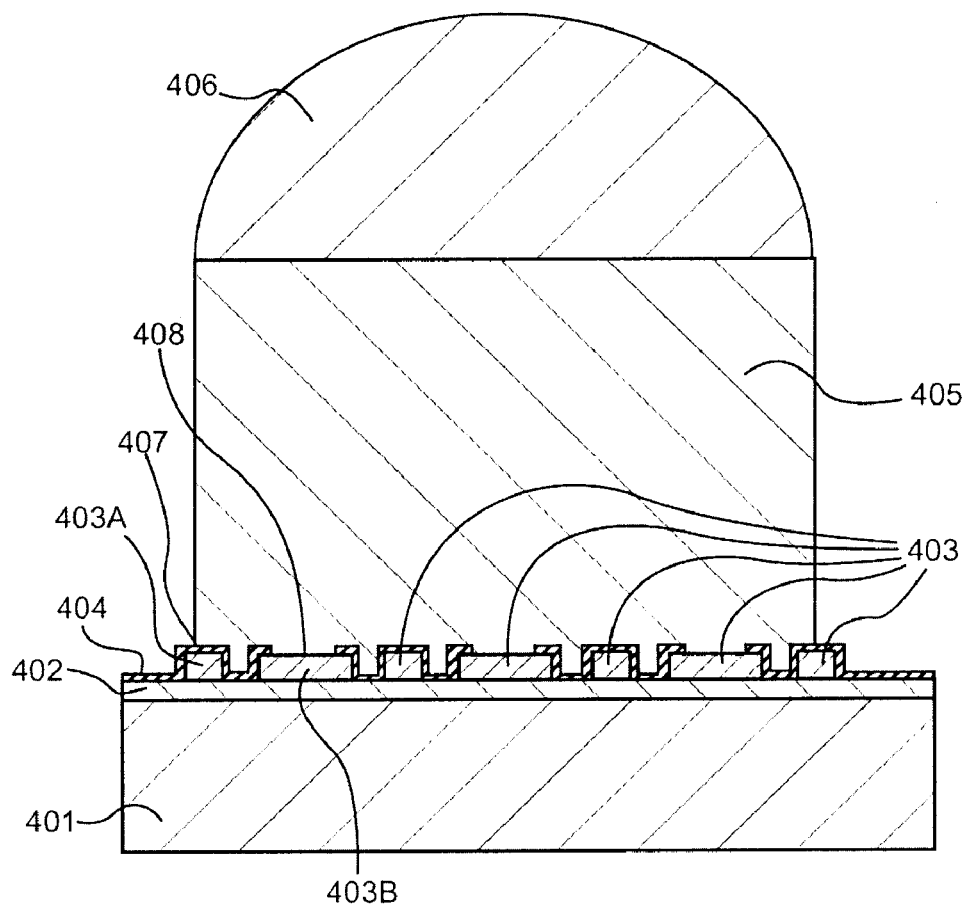
FIG. 4 shows a cross-sectional view of a semiconductor structure in accordance with a representative embodiment.

FIG. 4 shows a cross-sectional view of a semiconductor structure 400 in accordance with a representative embodiment. Some of the details of the representative embodiments described in connection with FIGS. 2A-3 are common to the presently described representative embodiment. Some of the common details are not repeated in order to avoid obscuring the description of the present embodiment. For example, details of representative materials and methods of fabricating features of the semiconductor structure 400 are generally not repeated.

The semiconductor structure 400 comprises a substrate 401 and a passive electrical component layer 402 provided thereover. The passive electrical component layer 402 comprises passive electrical components disposed thereover, or formed therein, or both, to provide the passive electrical components of the semiconductor structure 400. It is contemplated that the passive electrical component layer 402 not be a separate and distinct layer from the substrate 401, but rather may be a portion of the substrate 401 over which or in which passive electrical (or both) components are provided. The passive electrical components may be resistors, capacitors, transmission lines, and inductors, such as described above and fabricated using known methods and materials.

A metal layer 403 is provided over the passive electrical component layer 402. Notably, the metal layer 403 is the only metal layer of the semiconductor structure 400 and provides all current handling requirements for the underlying passive electrical components. The metal layer 403 provides selective electrical connection to the passive electrical components. Illustratively, the metal layer 403 comprises gold and has a thickness of approximately 2.0 μm. With such a thickness, the features size of the traces of the metal layer 403 is approximately 2.0 μm; and the pitch of adjacent features is approximately 4.0 μm, for example.

A dielectric layer 404 is provided over the metal layer 403 as shown. Illustratively, the dielectric layer comprises silicon nitride and has a thickness of approximately 0.8 μm. An electrically conductive pillar ("pillar") 405 is provided over the dielectric layer 404 and the metal layer 403. The electrical connection between the passive electrical components of the passive electrical component layer 402, the metal layer 403 and the pillar 405 may provide a signal connection or a ground connection, depending on the connection of the pillar 405 to external circuitry (not shown). As noted above, the present teachings contemplate a plurality of pillars 405 selectively connected (electrically or thermally, or both) to different areas of the substrate 401, and to passive electrical components disposed thereover and formed therein.

Illustratively, the pillar 405 comprises copper and has a thickness of approximately 55 μm to approximately 60 μm. The pillar 405 may comprise multiple layers of the same or different materials as described above. An optional solder bump 406 is provided over the pillar 405. The solder bump 406 illustratively comprises an alloy of copper and tin and has a thickness of approximately 25 μm to approximately 30 μm.

The dielectric layer 404 is provided over a surface 407 of a trace 403A of the metal layer 403 and between the metal layer 403 and the pillar 405. Thus, the pillar 405 is not in direct contact with trace 403A, but instead is in direct contact with and is disposed on the dielectric layer 404. The dielectric layer 404 thereby electrically isolates the trace 403A from the pillar 405. However, the dielectric layer 404 provides a mechanical connection between the trace 403A and the pillar 405. As described above, this mechanical connection fosters heat dissipation from the trace 403A to the pillar 405, and thereby heat from the underlying active semiconductor device can be dissipated through the pillar 405.

By contrast, the dielectric layer 404 is removed (e.g., by etching) from a surface 408 of a trace 403B of the metal layer 403. As such, the pillar 405 is in direct contact with and is disposed directly on trace 403B of the metal layer 403. Thus, trace 403B of the metal layer 403 electrically connects the pillar 405 to the passive electrical components. Depending on the connection of the pillar 405 to the external circuitry (not shown), the electrical connection between the metal trace 403B and the pillar 405 will be either an electrical signal connection or an electrical ground connection. Accordingly, the removal of the dielectric layer 404 from surface 408 provides an electrical connection (signal or ground) and a mechanical connection between the trace 403B of the metal layer 403 and the pillar 405. Thereby, electrical and thermal connection can be made from underlying active semiconductor device through the metal layer 403 to the pillar 405.

Figure 5:
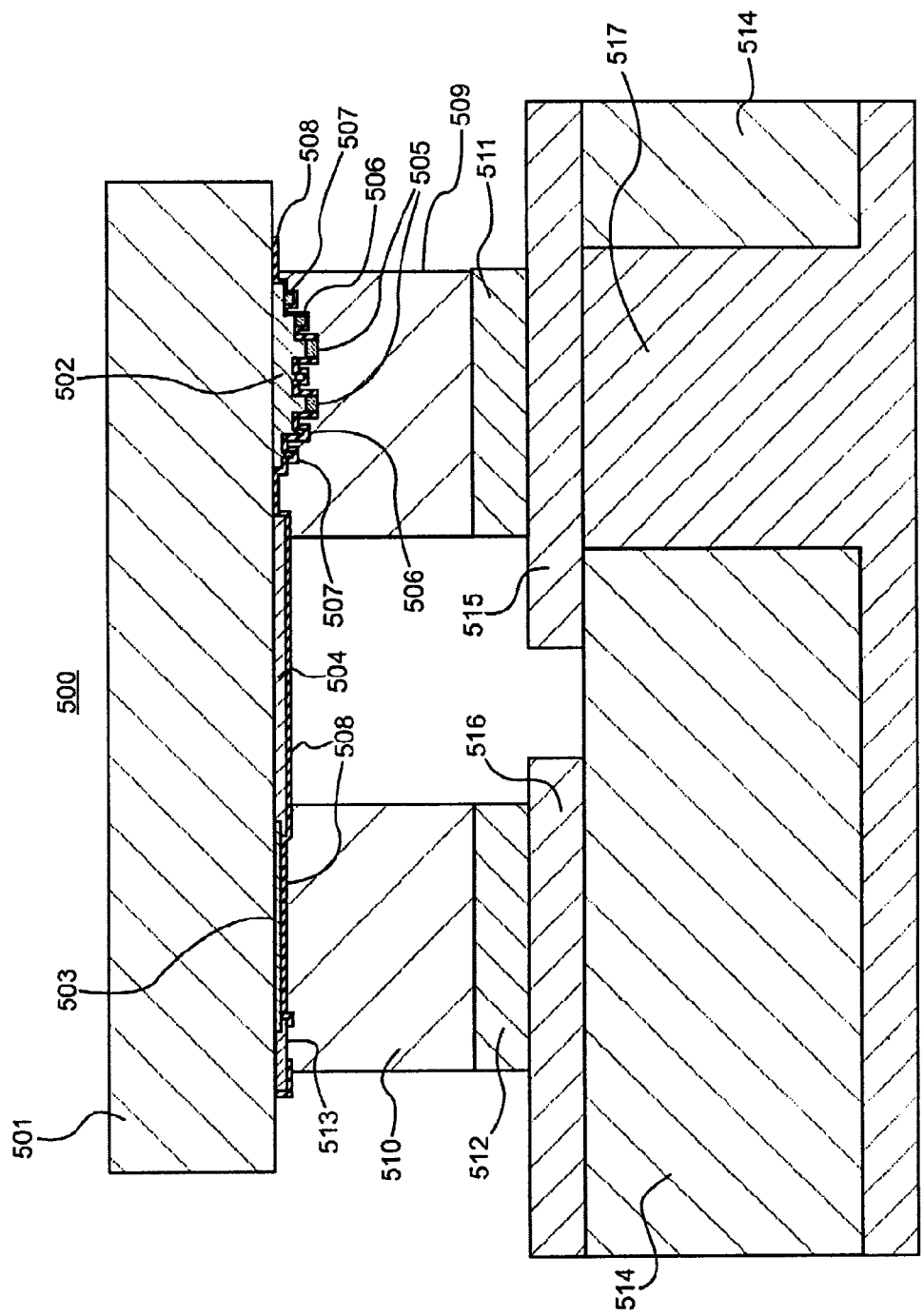
FIG. 5 shows a cross-sectional view of a semiconductor structure in accordance with a representative embodiment.

FIG. 5 shows a cross-sectional view of a semiconductor structure 500 in accordance with a representative embodiment. Some of the details of the representative embodiments described in connection with FIGS. 2A~4 are common to the presently described representative embodiment. Some of the common details are not repeated in order to avoid obscuring the description of the present embodiment. For example, details of representative materials and methods of fabricating features of the semiconductor structure 500 are generally not repeated.

The semiconductor structure 500 comprises a first substrate 501, which illustratively comprises a semiconductor material. The semiconductor structure 500 comprises an active semiconductor device 502 and a passive electrical component 503. Illustratively, the active semiconductor device 502 comprises an HBT and the passive electrical component 503 comprises a resistor. It is emphasized that these are merely illustrative, and that other active semiconductor devices and other passive electrical components are contemplated. As noted above in the description of the embodiments of FIGS. 2A~4, the selection of the semiconductor material of the first substrate 501 is generally dictated by the active semiconductor device(s) to be implemented thereon.

A transmission line 504 is provided over the first substrate 501 and is electrically connected to the passive electrical component 503. The active semiconductor device 502 comprises emitter traces 505, base traces 506 and collector traces 507. In keeping with the convention set forth in connection with the embodiments of FIG. 2A, the emitter traces 505 are components of the second (upper-most) metal layer of the semiconductor structure 500.

Dielectric layer 508 is selectively provided over the base traces 506 and the collector traces 507 as shown. The dielectric layer 508 is also selectively disposed over the transmission line 504 and the passive electrical component 503. The selective disposition of the dielectric provides electrical isolation of selected traces and electrical passive components as described more fully below.

The semiconductor structure 500 comprises a first pillar 509 and a second pillar 510 disposed over the first substrate 501. Because of the selection of electrical connections to the first pillar 509, the first pillar 509 comprises a "ground pillar." By contrast, because of the selection of the electrical connections to the second pillar 510, the second pillar 510 comprises a "signal pillar."

In the representative embodiment shown in FIG. 5, the first pillar 509 comprises a first solder bump 511, and the second pillar 510 comprises a second solder bump 512. As noted above, the present teachings contemplate a plurality of ground pillars (e.g., first pillar 509) and a plurality of signal pillars (e.g., second pillar 510) selectively connected (electrically or thermally, or both) to different areas of the first substrate 501, and to active semiconductor devices and passive electrical components disposed thereover and formed therein.

A signal trace 513 electrically connects the passive electrical component 503 to the second pillar 510. This electrical connection is effected by selectively removing the dielectric layer 508 over the signal trace 513. Similarly, the emitter traces 505 are electrically connected to the first pillar 509. In the representative embodiment, the first pillar 509 is disposed directly on and in direct contact with the emitter traces 505 of the upper-most metal layer of the semiconductor structure 500. As such, the emitters of the active semiconductor device 502 are electrically connected to the first pillar 509. By contrast, the dielectric layer 508 is provided between the base traces 506, the collector traces 507 and the transmission line 504. Thus, the first pillar 509 is not in direct contact with base traces 506 or collector traces 507, but instead is in direct contact with and is disposed on the dielectric layer 508. As such, the bases and the collectors of the active semiconductor device 502 are electrically isolated from the first pillar 509 and the transmission line 504 is electrically isolated from both the first pillar 509 and the second pillar 510. However, and as described above in detail in connection with representative embodiments, the dielectric layer 508 provides a mechanical connection to the isolated traces, contacts, passive electrical components and portions of the active semiconductor devices of the semiconductor structure 500. This mechanical connection provides a thermal path for dissipating heat from the semiconductor structure 500 as well as provides a more robust mechanical structure.

The first and second pillars 509, 510 are connected to a second substrate 514. The second substrate 514 is illustratively a printed circuit board or similar substrate that connects the active semiconductor devices and passive electrical components disposed over or in the first substrate 501 to electrical circuits (not shown) disposed over the second substrate 514, or formed therein, or connected thereto, or a combination thereof. Illustratively, known substrates including FR4, FR5, epoxy laminate, High Density Interconnect (HDI) substrates, Low Temperature Cofired Ceramic (LTCC) substrates, Thin Film on Ceramic substrates and Thick Film on Ceramic substrates are contemplated. The second substrate 514 comprises electrical circuitry comprising active semiconductor devices (not shown), or passive electrical components (not shown), or both, provided thereon or thereover. This electrical circuitry comprises the "external circuitry" alluded to above, and can be connected to additional electrical circuitry (not shown) connected to the electrical circuitry of the second substrate 514.

A printed circuit ground trace 515 is provided between the first pillar 509 and the second substrate 514. A printed circuit signal trace 516 is provided between the second pillar 510 and the second substrate 514. A via 517 is in contact with the printed circuit ground trace 515 and provides a thermal path for dissipation of heat as well as an electrical ground for connection to the first pillar 509.

The semiconductor structure 500 of the representative embodiment provides two pillars (first pillar 509 and second pillar 510) over a common substrate (first substrate 501), which provide selective electrical and thermal connections to another substrate (second substrate 514). The configuration allows for the connection of electrical signals traces and electrical ground traces to be selectively connected to the printed circuit ground trace 515 and the printed circuit signal trace 516 as shown. Moreover, the first pillar 509 and the second pillar 510 foster dissipation of heat from the active semiconductor devices and passive electrical components provided over the first substrate 501.

It is emphasized that the configuration of the semiconductor structure 500 is merely illustrative. Notably, rather than connecting the emitter traces 505 of the active device (e.g., the HBT) electrically to ground through the connection of the first pillar 509 to the printed circuit ground trace 515, the emitter traces 505 could be connected to the printed circuit signal trace 516. Such connections would result from the variation of the connection of the first pillar 509 and the second pillar 510 to the respective signal and ground traces. Similarly, the passive electrical component 503 could be connected electrically to ground through the connection of the second pillar 510 to the printed circuit signal trace 516. Moreover, the present teachings contemplate that both the first pillar 509 and the second pillar 510 are electrically connected to the printed circuit ground trace 515 or both are connected to the printed circuit signal trace 516. In this manner the connection of the passive electrical components and active semiconductor devices provided over the first substrate 501 can be electrically connected as desired to the second substrate 514 and the circuitry thereon or connected thereto.

Regardless of the electrical connections of the first pillar 509 and the second pillar 510, both pillars provide a thermal path for heat dissipation. This path of heat dissipation may be provided through the dielectric layer 508 in instances where the dielectric layer 508 provides electrical isolation of underlying signal traces (e.g., base traces 506 and collector traces 507); and directly to the pillars where the dielectric layer 508 is removed from over the underlying signal trace (e.g., emitter traces 505).

Additionally, it is again emphasized that the semiconductor structure 500 may comprise a plurality of pillars configured to connect the first substrate 501 to the second substrate 514 in order to selectively effect electrical connections, or ground connections, or both, and to provide thermal paths for heat dissipation between active semiconductor devices, or passive electrical components, or both. As such, by providing a plurality of pillars between the first substrate 501 and the second substrate 514, a packaged semiconductor structure comprising active semiconductor devices and passive electrical components disposed over, or in or on a first substrate is realized in accordance with the present teachings.

Figure 1:
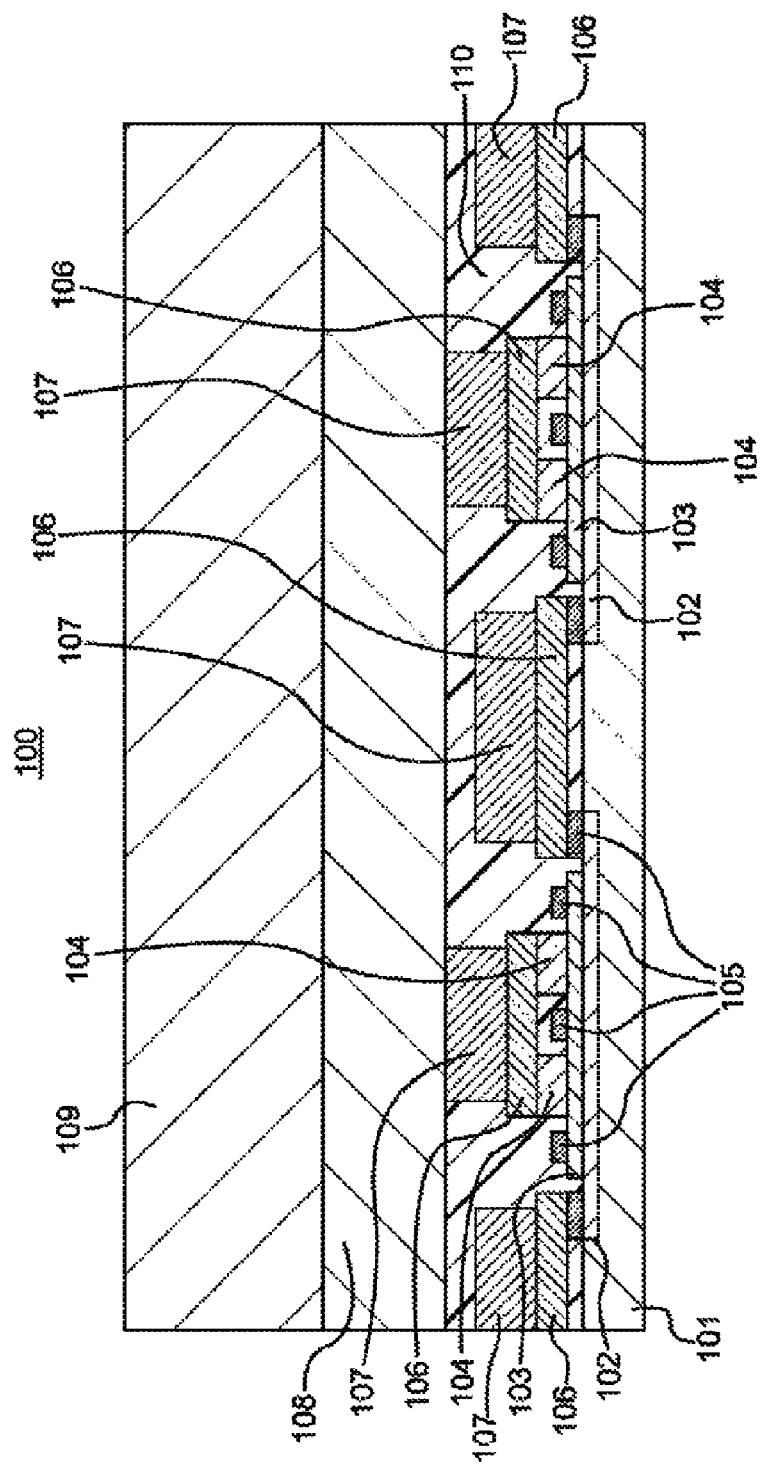
FIG. 1 shows a cross-sectional view of a conventional semiconductor structure.

As discussed above, various embodiments enable mechanical and/or electrical connections between a conductive pillar and first and second metal layers of a semiconductor structure without a third (upper-most) metal layer (e.g., third metal layer 109 in FIG. 1). However, in the absence of a third metal layer, moisture may be able to seep under the conductive pillar (e.g., pillar 209 in FIGS. 2A and 2B) and through the dielectric layer (e.g., dielectric layer 208 in FIGS. 2A and 2B), potentially causing short circuits, for example, between the conductive pillar and terminals of the semiconductor devices (e.g., collector 202, base 203 and/or emitter 204 of FIGS. 2A and 2B). Therefore, there is a need for a moisture barrier to prevent seepage of moisture.

Figure 6:
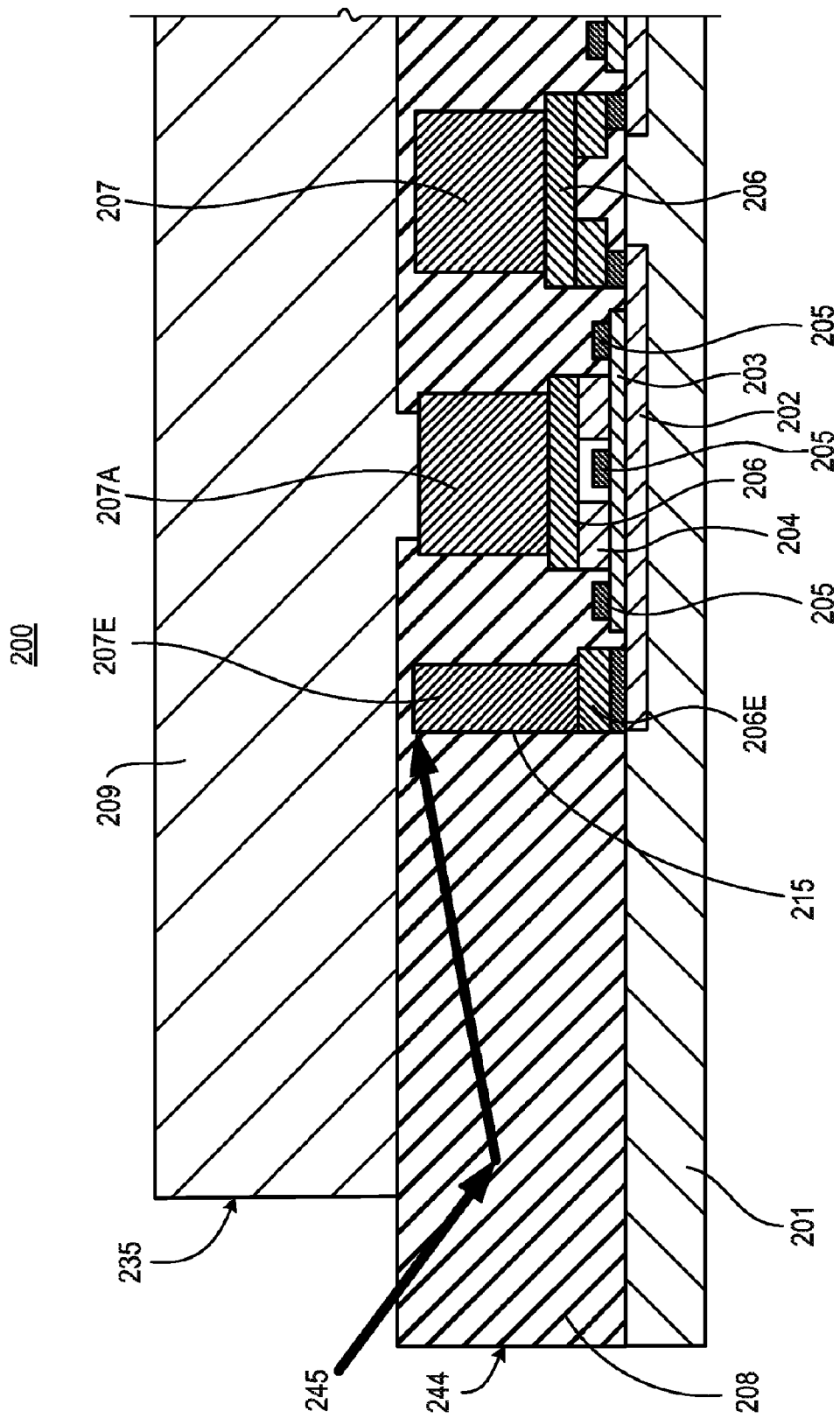
FIG. 6 shows a cross-sectional view of a semiconductor structure without a moisture barrier.

FIG. 6 shows a cross-sectional view of an end portion of the semiconductor structure depicted in FIG. 2A, including an illustrative moisture path.

Referring to FIG. 6, an end portion or edge of the semiconductor structure 200 is exposed to moisture, indicated by illustrative moisture path 245. This is particularly the case when outer edge 235 of the pillar 209 ends short of outer edge 244 of the dielectric layer 208, as shown in FIG. 6. As discussed above, the representative HBT closest to the outer edge 235 comprises the collector 202, the base 203 and the emitter 204 formed in/over the substrate 201 with known materials and by known methods. The first metal layer 206 is selectively disposed over the contacts 205 to the base 203 and the collector 202, and over the emitter 204, and the second metal layer 207 is selectively disposed over the first metal layer 206. In the representative embodiment, the second metal layer 207 may comprise signal traces, such as trace 207A, for carrying electrical signals to and from the collector 202, electrical ground traces for connection to the emitter 204, and provides thermal paths to the pillar 209 for heat dissipation.

In addition, collector Vcc bias structure 215 is shown between the outermost HBT and the outer edge 235 of the pillar 209, although in alternative configurations, the HBT itself or another (active or passive) electrical component may be closest to the outer edge 235. The collector Vcc bias structure 215 comprises trace 207E of the second metal layer 207 stacked on trace 206E of the first metal layer 206. The dielectric layer 208 is selectively disposed over the HBT, the Vcc bias structure 215, the contacts 205, the first metal layer 206 and the second metal layer 207, providing electrical isolation of certain traces and mechanical support of layers disposed over the dielectric layer 208. The pillar 209 is formed over the surfaces of the surfaces of the dielectric layer 208 and the second metal layer 207. The materials, dimensions, arrangements and formation of these various features are as discussed above with regard to FIG. 2A, and therefore such details are not repeated.

Illustratively, the pillar 209 is in direct contact with and is disposed directly on trace 207A of the second metal layer 207. Thus, trace 207A of the second metal layer 207 electrically connects the pillar 209 to the first metal layer 206, and ultimately to the emitter 204 of the HBT as shown. By contrast, trace 207E of the second metal layer 207 is mechanically connected to the pillar 209, but is electrically isolated from the pillar 209 by the dielectric layer 208. Thus, the pillar 209 is not in direct contact with trace 207E, but instead is in direct contact with and is disposed on the dielectric layer 208. As such, the Vcc bias structure 215 is electrically isolated from the pillar 209. However, the mechanical connection between the collector 202, the dielectric layer 208 and the pillar 209 provides a thermal path for conduction of heat via the trace 207E of the second metal layer 207 to the pillar 209 through the dielectric layer 208.

As indicated generally by the moisture path 245, without a third metal layer, moisture is able to travel beneath the pillar 209 and/or penetrate the dielectric layer 208. The moisture may be able to reach the HBT or other portions of the semiconductor structure 200, and cause electrical shorts between the pillar 209 and other electrodes if cracking or other defects exit in the dielectric layer 208.

Figure 7A:
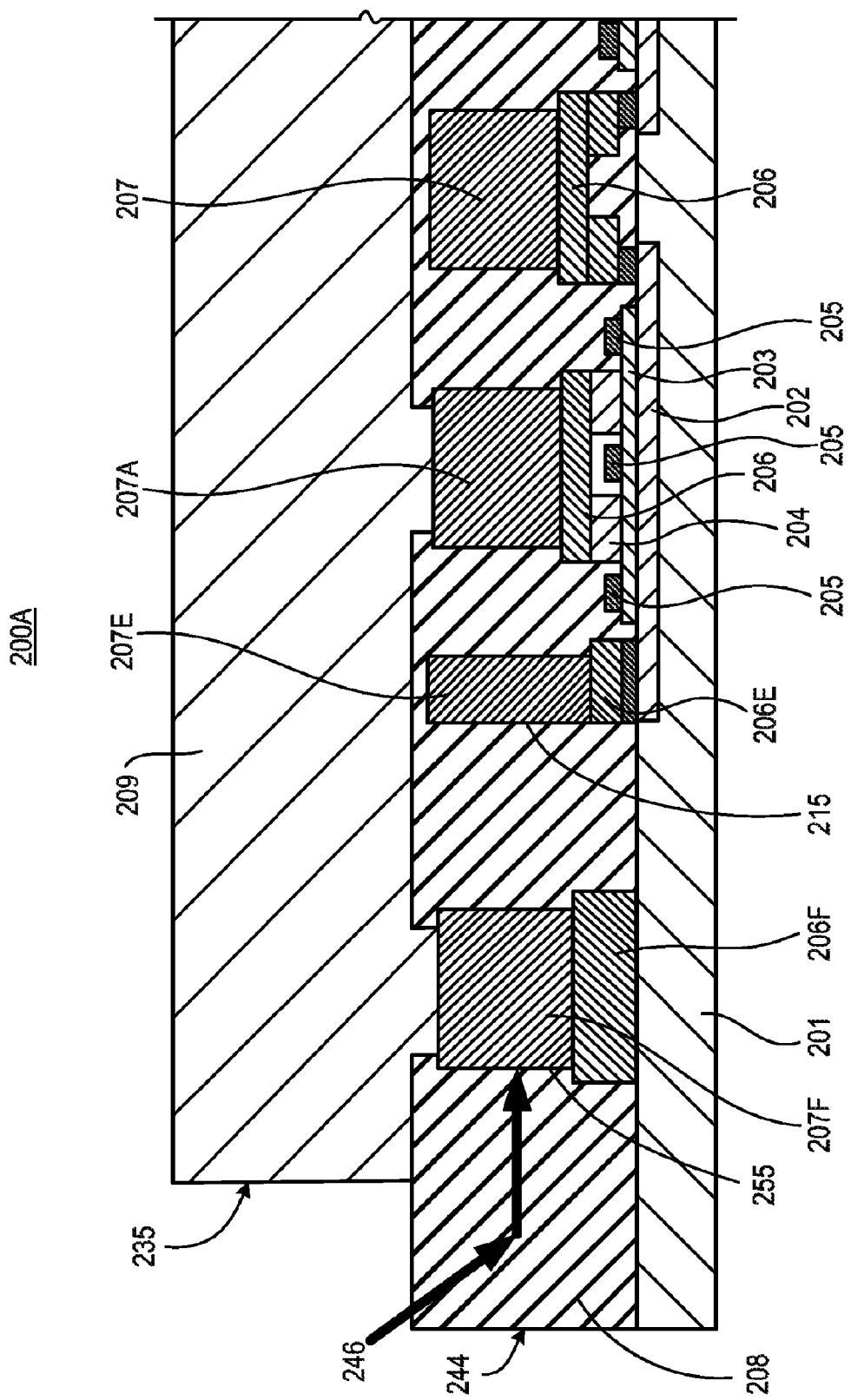
FIGS. 7A-7C show cross-sectional views of semiconductor structures with moisture barriers in accordance with representative embodiments.
Figure 7B:
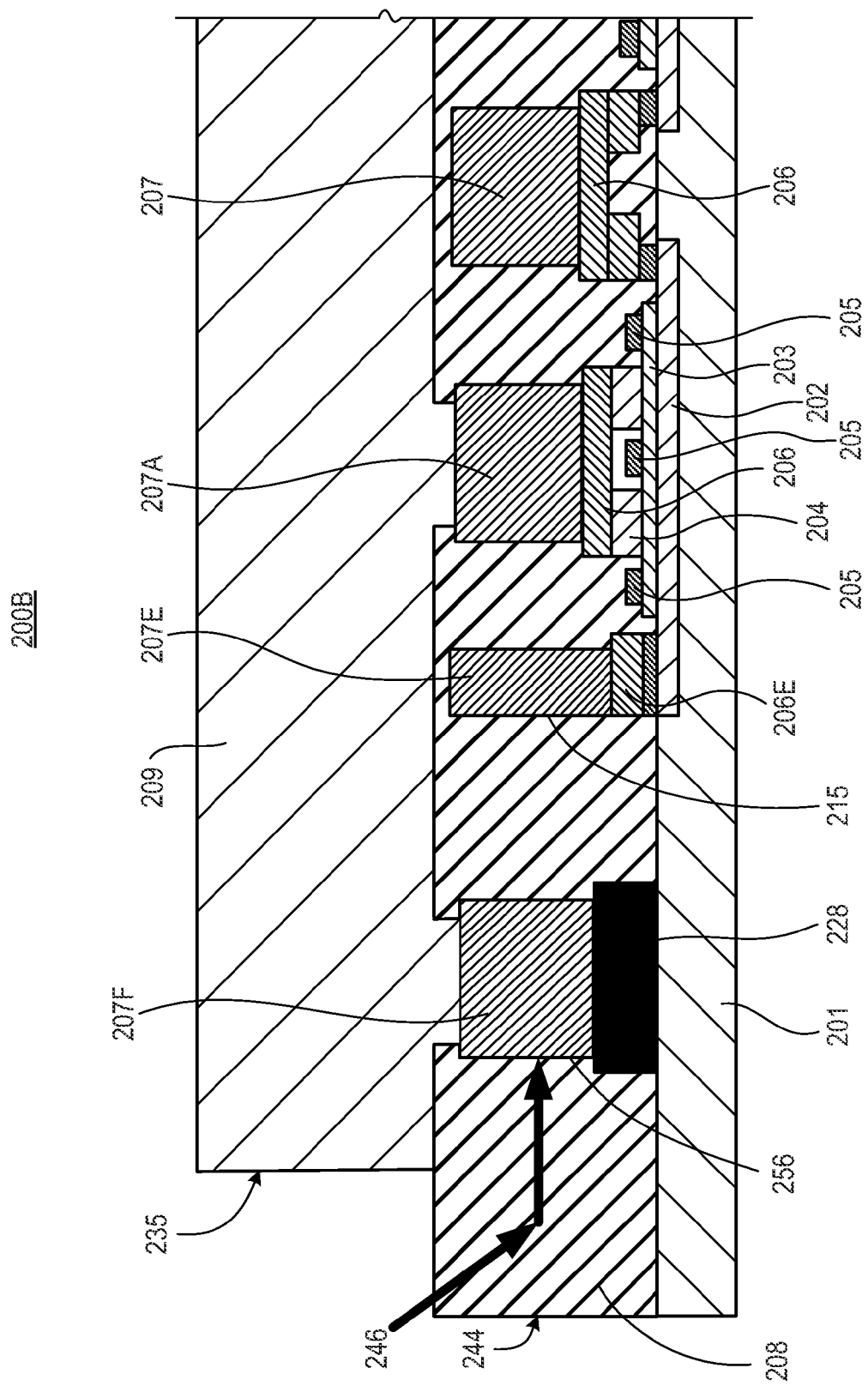
Figure 7C:
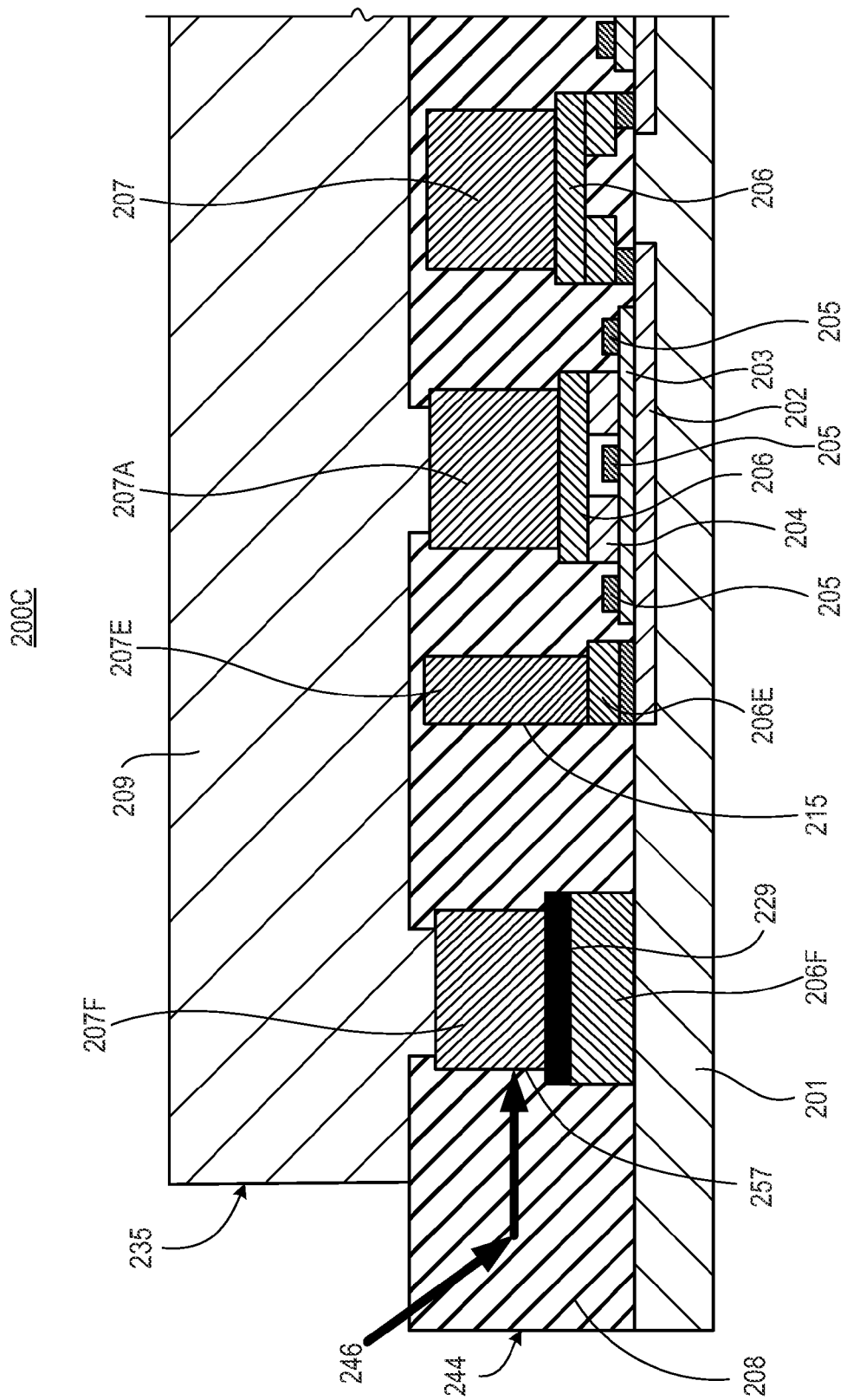

FIGS. 7A-7C show cross-sectional views of semiconductor structures, including corresponding moisture barriers, in accordance with representative embodiments. Features of the semiconductor structures are common to the semiconductor structure 200 of FIG. 2A, and thus details of these common features may not be repeated so as to avoid obscuring the details of the presently described embodiments.

FIG. 7A shows a cross-sectional view of a semiconductor structure 200A, which includes moisture barrier 255, in accordance with a representative embodiment. In the depicted embodiment, the moisture barrier 255 comprises trace 206F of the first metal layer 206 on substrate 201, and trace 207F of the second metal layer 207 stacked directly on the trace 206F, making electrical and mechanical contact. The moisture barrier 255 is surrounded by the dielectric layer 208, although a top surface of the trace 207F is exposed, such that the pillar 209 is in direct electrical and mechanical contact with the trace 207F. Thus, the trace 206F of the moisture barrier 255 may be grounded via the trace 207F and the pillar 209. Alternatively, the surface of the dielectric layer 208 may be substantially flush with the surface of the second metal layer 207. In this case, a thin insulating layer, formed of silicon nitride ($Si_3N_4$) or silicon dioxide ($SiO_2$), for example, may be selectively provided on the surfaces of the dielectric layer 208 and the second metal layer 207, covering portions of the second metal layer 207 that are to be electrically isolated from the pillar 209 (e.g., trace 207E) and exposing portions of the second metal layer 207 that are to be electrically connected to the pillar 209 (e.g., trace 207F and trace 207A).

Figure 8:
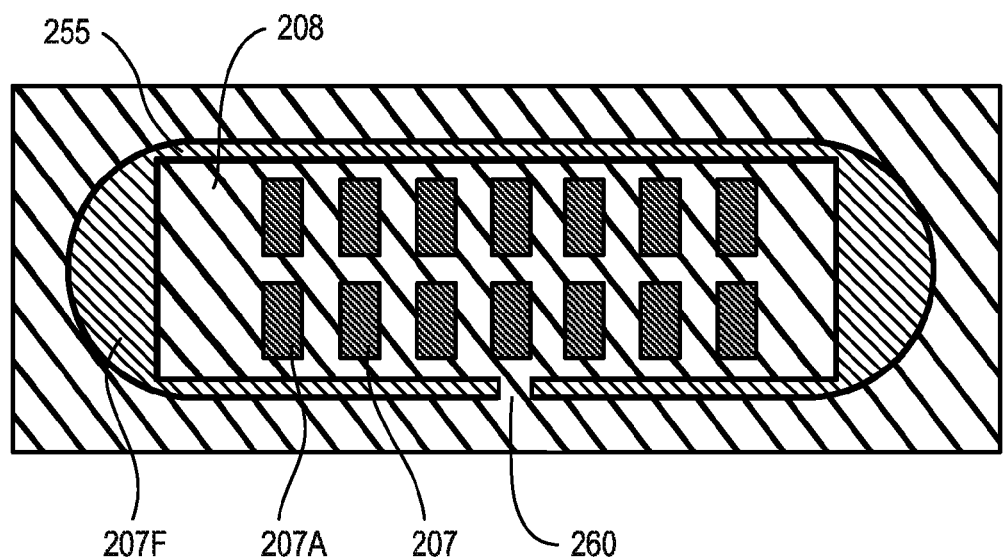
FIG. 8 shows a top view of the semiconductor structure of FIG. 7A with a moisture barrier before disposition of the pillar in accordance with a representative embodiment.

In an embodiment, the moisture barrier 255 is located near the outer edge 235 of the pillar 209, and peripherally surrounds the circuitry of the semiconductor structure 200A, including the depicted illustrative HBT and other (active or passive) electrical components, thus forming a "guard ring." FIG. 8 shows a top view of the semiconductor structure 200A of FIG. 7A, for example, before disposition of the pillar 209. The configuration of the semiconductor structure 200A shown in FIG. 8 is similar to that of the semiconductor structure shown in FIG. 3, and includes the moisture barrier 255.

More particularly, trace 207F of the moisture barrier 255 is exposed through the dielectric layer 208, indicating that the moisture barrier 255 forms a guard ring around the periphery of the semiconductor structure 200A. In an embodiment, a gap 260 may be formed in a portion of the moisture barrier 255, so that various design rule checks are satisfied, such as no "donut structures" for the second metal layer 207. The gap 260 should be small, for example, approximately 4 µm, although the size and position of the gap 260 may vary, or the gap 260 may be excluded, in various configurations. Also, in order to accommodate the peripherally disposed moisture barrier 255, the pillar 209 may comprise copper having a thickness at least approximately 30 µm and a width at least approximately 20 µm, for example. As stated above, the thermal and electrical conductivity of copper are advantageous over other conductors such as gold. However, other electrically and thermally conductive materials are contemplated for use as the pillar 209.

As should be appreciated, each exposed trace of the second metal layer 207 (e.g., trace 207A) may provide an electrical and mechanical connection to the first metal layer 206 (not shown in FIG. 8) and the selected components of the underlying HBT. For example, in the presently described embodiment, the exposed traces of the second metal layer 207 make electrical contact to the emitter 204 (not shown in FIG. 8) via the first metal layer 206. By contrast, the unexposed metal traces of the second metal layer 207 (e.g., trace 207B (not shown in FIG. 8)) are covered by the dielectric layer 208, or by a thin insulating layer, discussed above, and are thus electrically isolated from the pillar 209 (not shown in FIG. 8). For example, in the presently described embodiment, electrically isolated traces of the second metal layer 207 provide electrical isolation of the collector 202 and the pillar 209. However, the mechanical connection between the pillar 209 and the electrically isolated traces of the second metal layer 207 is provided. This provides a thermal path for heat dissipation from the collector 202, for example.

FIG. 7B shows a cross-sectional view of a semiconductor structure 200B, which includes moisture barrier 256, in accordance with another representative embodiment. In the depicted embodiment, the moisture barrier 256 comprises insulating spacer 228 on substrate 201, and trace 207F of the second metal layer 207 stacked on the insulating spacer 228. The moisture barrier 256 is surrounded by the dielectric layer 208, although a top surface of the trace 207F is exposed, such that the pillar 209 is in direct electrical and mechanical contact with the trace 207F. The insulating spacer 228 may be formed of any insulating or dielectric material, such as silicon nitride ($Si_3N_4$) or silicon dioxide ($SiO_2$), for example, that is impervious to moisture. Using the insulating spacer 228 depicted in FIG. 7B in place of the trace 206F enables separation of the first metal layer 206 from the trace 207F of the second metal layer 207, and use of the first metal layer 206 to electrically contact other structures under the pillar 209.

Similarly, FIG. 7C shows a cross-sectional view of a semiconductor structure 200C, which includes moisture barrier 257, in accordance with another representative embodiment. In the depicted embodiment, the moisture barrier 257 comprises trace 206F of the first metal layer 206 on substrate 201, insulating spacer 229 stacked on the trace 206F, and trace 207F of the second metal layer 207 stacked on the insulating spacer 229. The moisture barrier 257 is surrounded by the dielectric layer 208, although a top surface of the trace 207F is exposed, such that the pillar 209 is in direct electrical and mechanical contact with the trace 207F. The insulating spacer 229 electrically insolates the trace 206F from the trace 207F, and may be formed of any insulating or dielectric material, such as silicon nitride (Si$_3$N$_4$) or silicon dioxide (SiO$_2$), for example, that is impervious to moisture. Placement of the insulating spacer 229 between traces 206F and 207F, as depicted in FIG. 7C, enables the trace 206F to be used as an electrical contact to other electrodes inside the moisture barrier 257 without electrically shorting the electrodes to the pillar 209.

As discussed above in regard to the moisture barrier 255, the moisture barriers 256 and 257 may peripherally surround the circuitry of the semiconductor structure 200B and 200C, respectively, including the depicted illustrative HBT and other (active or passive) electrical components, thus forming guard rings to protect against moisture. The moisture barriers 256 and 257 would appear substantially the same as the moisture barrier 255 shown in FIG. 8.

The representative moisture barriers 255, 256 and 257 may be included with other types of semiconductor structures, including representative semiconductor structures 210, 400 and 500, having a pillar connected to HBTs without a third metal layer, as discussed above. Further, the representative moisture barriers 255, 256 and 257 may be included with semiconductor structures having various active and passive electrical components in addition to or instead of HBTs, as discussed above. Illustratively, active devices may include a pseudomorphic high electron mobility transistor (pHEMT), an enhanced pseudomorphic high electron mobility transistor (E-pHEMT), or a metal oxide semiconductor (MOS) device such as a MOS field effect transistor (MOSFET) or complementary MOS (CMOS) device. Also, passive electrical components may include resistors, capacitors, signal transmission lines (transmission lines) and inductors, for example.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A semiconductor structure, comprising:
a plurality of semiconductor devices on a substrate;
a metal layer disposed over the plurality of semiconductor devices, the metal layer comprising at least a first trace and a second trace;
a conductive pillar disposed directly on and in electrical contact with the first trace of the metal layer;
a dielectric layer selectively disposed between the metal layer and the conductive pillar, wherein the dielectric layer electrically isolates the second trace from the conductive pillar; and
a moisture barrier surrounding the plurality of semiconductor devices along a periphery of the semiconductor structure, and extending from the substrate through the dielectric layer to the conductive pillar.

2. The semiconductor structure of claim 1, wherein the moisture barrier is located between the first trace of the metal layer and an outer edge of the conductive pillar.

3. The semiconductor structure of claim 1, wherein the moisture barrier comprises a third trace, which is formed as part of the metal layer.

4. The semiconductor structure of claim 3, wherein the moisture barrier further comprises an insulating spacer located between the third trace and the substrate.

5. The semiconductor structure of claim 3, wherein the moisture barrier further comprises a fourth trace, which is formed as part of another metal layer disposed between the metal layer and the plurality of semiconductor devices.

6. The semiconductor structure of claim 5, wherein the moisture barrier further comprises an insulating spacer located between the third and fourth traces.

7. A semiconductor structure, comprising:
a semiconductor device on a substrate;
a first metal layer comprising a first trace disposed over the semiconductor device;
a second metal layer comprising second and third traces, the second trace being disposed over the first trace of the first metal layer and the third trace being separated from the first and second traces by a dielectric layer;
a moisture barrier comprising at least the third trace of the second metal layer; and a conductive pillar disposed directly on and in mechanical contact with the second trace and the third trace of the second metal layer, wherein the moisture barrier is located between the second trace of the second metal layer and an outer edge of the conductive pillar, and extends from the substrate through the dielectric layer to the conductive pillar, preventing moisture from entering the semiconductor device through the dielectric layer.

8. The semiconductor structure of claim 7, wherein the moisture barrier surrounds the semiconductor device around a periphery of the semiconductor structure, forming a guard ring.

9. The semiconductor structure of claim 7, wherein the guard ring includes a gap.

10. The semiconductor structure of claim 7, wherein semiconductor device comprises a heterojunction bipolar transistor (HBT).

11. The semiconductor structure of claim 7, wherein semiconductor device comprises a metal oxide semiconductor (MOS) device or a complementary MOS (CMOS) device.

12. The semiconductor structure of claim 7, wherein the moisture barrier further comprises an insulating spacer formed between the substrate and the third trace of the second metal layer.

13. The semiconductor structure of claim 12, wherein the insulating spacer comprises one of silicon nitride (Si$_3$N$_4$), silicon dioxide (SiO$_2$).

14. The semiconductor structure of claim 7, wherein the conductive pillar comprises copper.

15. The semiconductor structure of claim 14, wherein the second metal layer comprises at least one of gold, aluminum and copper.

16. The semiconductor structure of claim 7, wherein the first metal layer further comprises a fourth trace separated from the first trace by the dielectric layer, and
wherein the moisture barrier further comprises the fourth trace of the first metal layer, the third trace of the second metal layer being disposed over the fourth trace of the first metal layer.

17. The semiconductor structure of claim 16, wherein the third trace of the second metal layer is in mechanical contact with the fourth trace of the first metal layer.

18. The semiconductor structure of claim 16, wherein the third trace of the second metal layer is separated from the fourth trace of the first metal layer by an insulating spacer.

19. The semiconductor structure of claim 18, wherein the insulating spacer comprises one of silicon nitride ($Si_3N_4$) and silicon dioxide ($SiO_2$).

20. A semiconductor structure, comprising:
- a metal layer disposed over a semiconductor device, the metal layer comprising at least a first trace and a second trace;
- a conductive pillar disposed on and in direct electrical and mechanical contact with the first trace of the metal layer;
- a dielectric layer selectively disposed between the metal layer and the conductive pillar, wherein the dielectric layer electrically isolates the second trace from the pillar; and
- a moisture barrier around a periphery of the semiconductor structure, located between the first trace of the metal layer and an outer edge of the conductive pillar, and extending from a substrate of the semiconductor device through the dielectric layer to the conductive pillar.

* * * * *